US011201538B2

(12) United States Patent
Sakamoto

(10) Patent No.: US 11,201,538 B2
(45) Date of Patent: Dec. 14, 2021

(54) POWER CONVERSION DEVICE WITH TEMPERATURE PROTECTION

(71) Applicant: Mitsubishi Electric Corporation, Tokyo (JP)

(72) Inventor: Tatsuro Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 10 days.

(21) Appl. No.: 16/826,700

(22) Filed: Mar. 23, 2020

(65) Prior Publication Data

US 2020/0382003 A1 Dec. 3, 2020

(30) Foreign Application Priority Data

May 31, 2019 (JP) .............................. JP2019-101969

(51) Int. Cl.
| H02M 1/32 | (2007.01) |
| H02M 3/158 | (2006.01) |
| H02H 5/04 | (2006.01) |
| H02M 1/00 | (2006.01) |
| H02M 1/088 | (2006.01) |

(52) U.S. Cl.
CPC ............ *H02M 1/327* (2021.05); *H02H 5/041* (2013.01); *H02M 1/0054* (2021.05); *H02M 3/158* (2013.01); *H02M 1/088* (2013.01)

(58) Field of Classification Search
CPC ........ H02M 1/32; H02M 1/325; H02M 1/327; H02M 1/0054; H02M 3/158; H02M 3/1584; H02M 3/1586; H05K 7/20945; H02H 3/08; H02H 3/085; H02H 5/04; H02H 5/041;
(Continued)

(56) References Cited

U.S. PATENT DOCUMENTS 9,313,933 B2 * 4/2016 Sugahara ............. H05K 7/2029
10,156,482 B2 12/2018 Imakiire et al.
(Continued)

FOREIGN PATENT DOCUMENTS

JP 3075303 B2 8/2000
JP 2015-208081 A 11/2015
(Continued)

OTHER PUBLICATIONS

Communication dated Jul. 14, 2020, from the Japanese Patent Office in Application No. 2019-101969.

*Primary Examiner* — Alex Torres-Rivera
(74) *Attorney, Agent, or Firm* — Sughrue Mion, PLLC; Richard C. Turner

(57) ABSTRACT

Provided is a power conversion device capable of directly performing a protection operation according to the state of a cooler. A control unit includes: a semiconductor switching element loss calculation unit which calculates a loss in a semiconductor switching element with use of a switching state of the semiconductor switching element, and a current detection value or a voltage detection value; and a cooler state estimation unit which estimates a state of a cooler on the basis of a loss calculation value from the semiconductor switching element loss calculation unit and a temperature detection value from a temperature detector. The control unit limits current flowing to the semiconductor switching element on the basis of the state of the cooler.

20 Claims, 5 Drawing Sheets

(58) Field of Classification Search
CPC ........ H02H 5/042; H02H 5/044; H02H 5/047; H02H 7/0852; H02P 29/60; H02P 29/68
See application file for complete search history.

(56) References Cited

U.S. PATENT DOCUMENTS

| | | | |
|---|---|---|---|
| 2005/0204761 A1* | 9/2005 | Karikomi | G01K 7/425 62/228.1 |
| 2012/0217795 A1* | 8/2012 | Hasegawa | B60L 3/003 307/9.1 |
| 2013/0147407 A1* | 6/2013 | Kawamura | G01K 3/04 318/400.21 |
| 2015/0188530 A1* | 7/2015 | Shinohara | H03K 3/011 327/172 |
| 2020/0052642 A1* | 2/2020 | Kuroki | H02P 29/02 |

FOREIGN PATENT DOCUMENTS

| | | |
|---|---|---|
| JP | 5880734 B2 | 3/2016 |
| WO | 2013/014798 A1 | 1/2013 |

* cited by examiner

POWER CONVERSION DEVICE WITH TEMPERATURE PROTECTION

BACKGROUND OP THE INVENTION

1. Field of the Invention

The present disclosure relates to a power conversion device.

2. Description of the Background Art

Power conversion devices for electric vehicles are required to operate without failure under various conditions and to enable a vehicle to continuously operate in an abnormal state.

A semiconductor switching element of a power conversion device may fail if power loss is generated in a switching operation and the junction temperature of the semiconductor switching element exceeds a predetermined value. Thus, it is important to accurately detect the junction temperature. However, since a junction is a joined portion of a semiconductor chip, it is difficult to directly measure the junction temperature.

To solve this problem, methods are disclosed in which the temperature of a semiconductor switching element is detected and a junction temperature is estimated using the detected temperature value and a loss calculated from an operation of the semiconductor switching element (for example, Patent Document 1).

Patent Document 1: Japanese Patent No. 5880734 (paragraphs [0023] to [0031], and FIGS. 1 and 2)

In the method disclosed in Patent Document 1, although the junction temperature is estimated from a correlation between the calculated loss and increase in the temperature, change in the state of a cooler is not considered. Therefore, when the state of the cooler is changed, a problem arises in that the junction temperature cannot be accurately estimated, and protection cannot be reliably performed.

SUMMARY OF THE INVENTION

The present disclosure has been made to solve the above problems, and an object of the present disclosure is to provide a power conversion de/ice capable of directly performing a protection operation according to the state of a cooler through determination of the state of the cooler.

The power conversion device disclosed in the present disclosure includes: a semiconductor switching element which converts power by a switching operation; a cooler which cools the semiconductor switching element; a control unit which controls the semiconductor switching element; a temperature detector which detects a temperature of the semiconductor switching element; a current detector which detects current flowing to the semiconductor switching element; and a voltage detector which detects voltage applied to the semiconductor switching element. The control unit includes: a semiconductor switching element loss calculation unit which calculates a loss in the semiconductor switching element with use of a switching state of the semiconductor switching element and both or either of a current detection value and a voltage detection value; and a cooler state estimation unit which estimates a state of the cooler from a loss calculation value from the semiconductor switching element loss calculation unit and a temperature detection value from the temperature detector. The control unit limits current flowing to the semiconductor switching element on the basis of the state of the cooler.

According to the power conversion device disclosed in the present disclosure, a power conversion device capable of reliably performing a protection operation even when the state of the cooler is changed, is obtained.

DETAILED DESCRIPTION OF THE PREFERRED EMBODIMENTS OF THE INVENTION

First Embodiment

Figure 1:
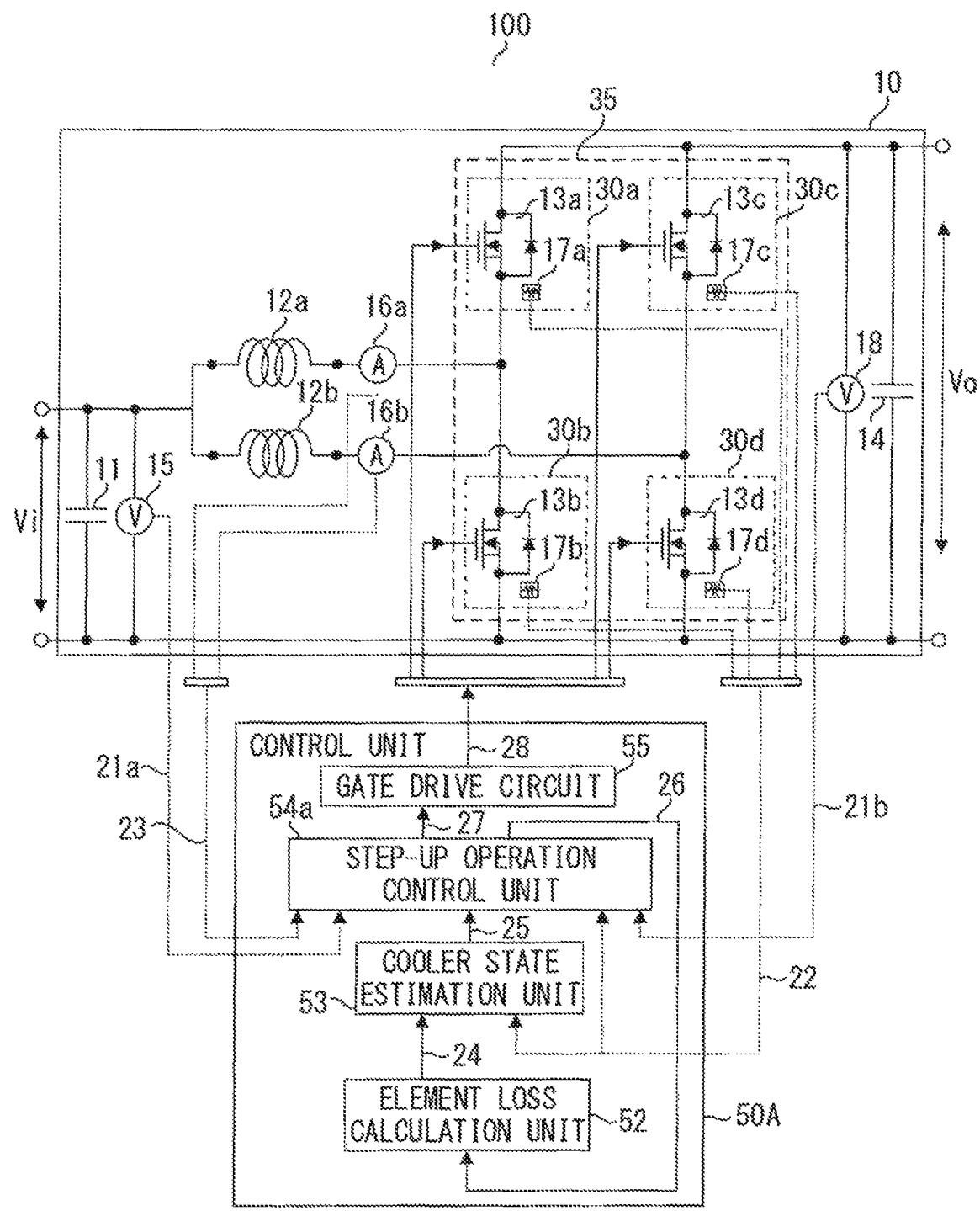
FIG. 1 is a block diagram showing a configuration of a power conversion device according to a first embodiment

A first embodiment relates to a power conversion device including: semiconductor switching elements which convert power; a cooler which cools the semiconductor switching elements; a control unit which controls the semiconductor switching elements; temperature detectors which detect temperatures of the semiconductor switching elements; current detectors which detect currents flowing to the semiconductor switching elements; and voltage detectors which detect voltages that are applied to the semiconductor switching elements. The control unit calculates losses in the semiconductor switching elements with use of switching states of the semiconductor switching elements, and current detection values or voltage detection values. The control unit estimates the state of the cooler from the loss calculation values and temperature detection values. The control unit limits currents flowing to the semiconductor switching elements on the basis of the state of the cooler.

Hereinafter, a configuration and an operation of the power conversion device according to the first embodiment will be described with reference to FIG. 1 which is a block diagram showing the configuration of the power conversion device, FIG. 2 which is a schematic diagram of a cooler thermal network for explaining influence of change in the state of the cooler, and FIG. 3 which is a block diagram showing a configuration of the cooler stats estimation unit.

First, the configuration of a power conversion device 100 according to the first embodiment will be described with reference to FIG. 1.

The power conversion device 100 includes a power conversion circuit 10 and a control unit 50A.

The power conversion device 100 according to the first embodiment is assumed to be used in an electric vehicle such as an electric automobile or a plug-in hybrid automobile and is assumed to drive a motor serving as a driving force source by power from a high-voltage battery.

The power conversion device 100 converts power by a switching operation using semiconductor switching elements such as IGBTs (Insulated Gate Bipolar Transistors) and MOSFETs (Metal Oxide Semiconductor Field Effect Transistors).

The power conversion circuit 10 is a two-phase interleaved step-up DC/DC converter circuit. The power conversion circuit 10 is broadly divided into an input section, a power conversion section, and an output section.

The input section of the power conversion circuit 10 includes an input smoothing capacitor 11 and step-up reactors 12a and 12b. Here, input voltage is denoted by Vi.

The power conversion section of the power conversion circuit 10 includes semiconductor switching elements 13a and 13b which are a pair of switching elements, and semiconductor switching elements 13c and 13d which are also a pair of switching elements.

In FIG. 1, the semiconductor switching elements 13a, 13b, 13c, and 13d are included in semiconductor modules 30a, 30b, 30c, and 30d, respectively.

The output section of the power conversion circuit 10 includes an output smoothing capacitor 14. Here, output voltage is denoted by Vo.

The power conversion circuit 10 further includes a cooler 35 which cools the semiconductor switching elements 13a to 13d. The cooler 35 of the power conversion device 100 according to the first embodiment is assumed to be a water-based cooler.

Each of the semiconductor switching elements 13a to 13d is an MOSFET in which a diode is included between the source and the drain.

The types and the number of the semiconductor switching elements, and the type of the power conversion device, are not limited thereto. For example, each semiconductor switching element may be an IGBT, a SiC-MOSFET, or the like, and the power conversion device may be an inverter or the like.

Next, the detectors of the power conversion circuit 10 will be described.

In the power conversion section of the power conversion circuit 10, temperature detectors 17a, 17b, 17c, and 17d as the temperature detectors are disposed inside or near the semiconductor modules 30a to 30d, respectively, to detect the temperatures of the semiconductor switching elements 13a to 13d.

The temperature detectors 17a to 17d which detect the temperatures of the semiconductor switching elements 13a to 13d may be disposed inside the semiconductor modules 30a to 30d or disposed, near the semiconductor modules 30a to 30d, on a board on which the semiconductor modules 30a to 30d are disposed. The temperature detectors are assumed to be thermistors.

The input section of the power conversion circuit 10 includes an input voltage detector 15 and reactor current detectors 16a and 16b.

The output section of the power conversion circuit 10 includes an output voltage detector 18.

Next, the control unit 50A will be described.

The control unit 59A includes a semiconductor switching element loss calculation unit 52, a cooler state estimation unit 53, a step-up operation control unit 54a, and a gate drive circuit 55.

In FIG. 1, the semiconductor switching element loss calculation unit is written as an element loss calculation unit.

An output signal from each of the detectors and functional, units will be described before a function and an operation of the control unit 50A are described.

A detected value from the input voltage detector 15 is referred to as an input voltage detection value 21a. Detected values from the reactor current detectors 16a and 16b are referred to as reactor current detection values 23a and 23b. Detected values from the temperature detectors 17a to 17d are referred to as temperature detection values 22a to 22d. A detected value from the output voltage detector 18 is referred to as an output voltage detection value 21b. The temperature detection values 22a to 22d are, as appropriate, referred to as temperature detection values 22, where the temperature detection values 22a to 22d do not particularly need to be distinguished from one another. Similarly, the reactor current detection values 23a and 23b are, as appropriate, referred to as reactor current detection values 23.

The reactor current detection values 23a and 23b and the temperature detection values 22a to 22d are not shown in FIG. 1.

An output signal from the semiconductor switching element loss calculation unit 52 is referred to as a semiconductor switching element loss calculation value 24. An output signal from the cooler state estimation unit 53 is referred to as cooler state information 25. Output signals from the step-up operation control unit 54a are referred to as semiconductor switching element loss calculation information 26 and a gate control signal 27. An output signal from the gate drive circuit 55 is referred to as a gate drive signal 28.

The semiconductor switching element loss calculation unit 52 receives semiconductor switching element loss calculation information 26 from the step-up operation control unit 54a, calculates losses in the semiconductor switching elements, and outputs semiconductor switching element loss calculation values 24.

The cooler state estimation unit 53 receives the semiconductor switching element loss calculation values 24 from the semiconductor switching element loss calculation unit 52 and temperature detection values 22 from the temperature detectors 17a to 17d, estimates a state of the cooler 35, and outputs cooler state information 25.

The step-up operation control unit 54a receives the cooler state information 25 from the cooler state estimation unit 53, an input voltage detection value 21a from the input voltage detector 15, reactor current detection values 23 from the reactor current detectors 16a and 16b, and an output voltage detection value 21b from the output voltage detector 18.

When receiving them, the step-up operation control unit 54a outputs a gate control signal 27 for controlling the step-up operation of the power conversion circuit 10 by switching ON/OFF of the semiconductor switching elements 13a to 13d. In addition, the step-up operation control unit 54a outputs semiconductor switching element loss calculation information 26.

The gate drive circuit 55 converts, into a gate drive signal 28, the gate control signal 27 generated by the step-up operation control unit 54a.

Next, increases in the junction temperatures of the semiconductor switching elements and a cooling effect of the cooler will be described with reference to FIG. 2 to ease the understanding of a function and an operation of the power conversion device 100 according to the first embodiment.

Figure 2:
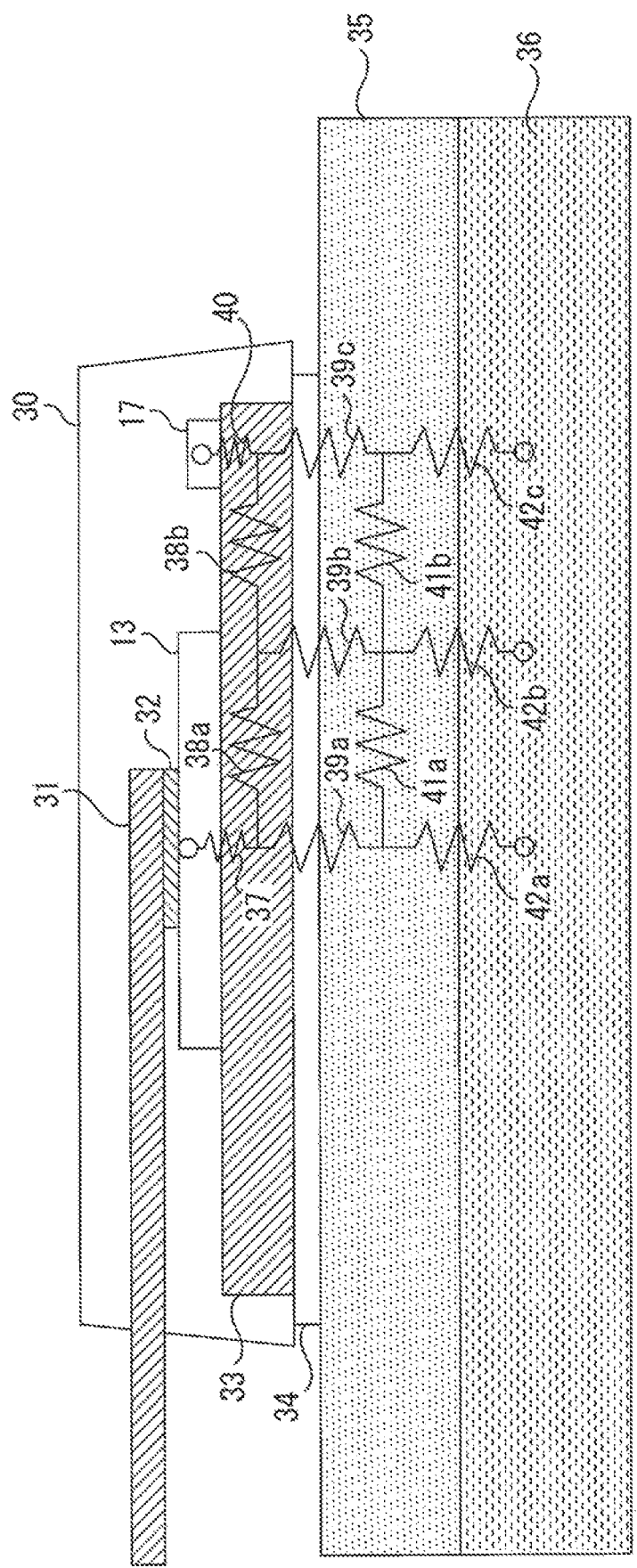
FIG. 2 is a schematic diagram of a cooler thermal network for explaining influence of change in the state of a cooler in the power conversion device according to the first embodiment.

FIG. 2 shows a thermal network for each semiconductor switching element, the corresponding temperature detector, and the cooler 35, in an example of the power conversion device in which the cooler 35 is used.

Change, due to change in the state of the cooler, in a correlation between heat resistance or electrical loss and increase in the temperature will be described. The Elements composing the coder thermal network will be described with reference to FIG. 2.

Each semiconductor nodule 30 is composed of the semiconductor switching element 13, a bus bar 31, solder 32, a substrate 33, and the temperature detector 17.

The semiconductor switching element 13 and the temperature detector 17 are disposed on the substrate 33, and the bus bar 31 is connected onto the semiconductor switching element 13 by solder 32.

The semiconductor module 30 is joined to the cooler 35 via an insulating member 34, and the cooler 35 is cooled by cooling water 36.

Although the temperature detector 17 is provided to detect the junction temperature of the semiconductor switching element 13, the temperature detector 17 cannot be directly disposed at a junction for structural reasons. Thus, as shown in FIG. 2, the temperature detector 17 is disposed near the semiconductor switching element 13.

Next, heat resistances composing the thermal network will be described.

Heat resistances on a direct heat transmission path from the junction of the semiconductor switching element 13 to the temperature detector 17, are referred to as heat resistances 37, 38a, 38b, and 40.

Heat resistances on a heat transmission path extending via the cooler 35, are referred to as heat resistances 39a, 39b, 39c, 41a, and 41b.

Heat resistances on a heat dissipation path to the cooling water 36, are referred to as heat resistances 42a, 42b, and 42c.

Here, when the state of the cooler 35 is normal, an increase in the temperature corresponding to a loss generated in the semiconductor switching element 13 is determined by the thermal network in FIG. 2 on the basis of the temperature of the cooling water 36.

Therefore, the junction temperature of the semiconductor switching element 13, the temperature detection value from the temperature detector 17, and the temperature of the cooling water 36 are uniquely determined.

Since the thermal network in FIG. 2 has a known configuration, the junction temperature of the semiconductor switching element 13 can be estimated from the temperature detected by the temperature detector 17.

However, in leakage of cooling water as an example of the change in the state of the cooler 35, the cooling water 36 flows out, and thus the heat dissipation path to the cooling water 36 is lost. In this case, the heat resistances 42a to 42c in the thermal network in FIG. 2 are not given.

FIG. 2 shows the thermal network only with the heat resistances for simplification. However, in fact, heat capacities are given in parallel to the heat resistances. The junction temperature of the semiconductor switching element 13 and the temperature detected by the temperature detector 17 each experience a transient temperature change with the heat capacities being dominant, from the initial state with a temperature distribution obtained when the cooling water 36 is lost.

As described above, when the state of the cooler 35 is changed, the thermal network is changed, and thus the relationship between the junction temperature of the semiconductor switching element 13 and the temperature detected by the temperature detector 17 is changed.

The purpose of the power conversion device 100 according to the first embodiment is to enable power conversion operation to appropriately continue so as to adapt to the change in the state of the cooler 35.

Hereinafter, a fundamental operation principle of the power conversion device 110 according to the first embodiment will be described.

In the control unit 50A, the step-up operation control unit 54a determines and controls switching patterns of the semiconductor switching elements 13a to 13d on the basis of the input voltage detection value 21a from the input voltage detector 15, the output voltage detection value 21b from the output voltage detector 18, and the reactor current detection values 23 from the reactor current detectors 16a and 16b such that the output voltage Vo becomes a target value. In addition, the step-up operation control unit 54a performs a predetermined protection operation on the basis of the cooler state information 25 from the cooler state estimation unit 53 and the temperature detection values 22 from the temperature detector 17a to 17d according to the state of the cooler 35 and the temperature detection values 22.

Next, a method for estimating the state of the cooler 35 which is the main feature of the power conversion device 100 according to the first embodiment, will be described.

The cooler state estimation unit 53 estimates the state of the cooler 35 on the basis of the semiconductor switching element loss calculation values 24 from the semiconductor switching element loss calculation unit 52 and the temperature detection values 22.

Losses in the semiconductor switching elements 13a to 13d are calculated on the basis of the semiconductor switching element loss calculation information 26 outputted from the step-up operation control unit 54a.

The semiconductor switching element loss calculation information 26 is calculated on the basis of a carrier frequency and a switching-ON time generated by the step-up operation control unit 54a, the reactor current detection values 23 from the reactor current detectors 16a and 16b, the input voltage detection value 21a from the input voltage detector 15, and the output voltage detection value 21b from the output voltage detector 18.

The semiconductor switching element loss calculation unit 52 holds loss characteristics of the switching elements and flyback diodes in advance, and calculates, as each semiconductor switching element loss calculation value 24, the total value of conduction losses and switching losses which are calculated for each switching element and each flyback diode with use of the loss characteristics.

The calculation of the semiconductor switching element loss calculation value 24 by the semiconductor switching element loss calculation unit 52 may be performed using all the information described above related to semiconductor switching losses, or may be performed using minimum necessary information, e.g., the carrier frequency and the switching-ON time, and the reactor current detection values 23 or the output voltage detection value 21b.

Next, a configuration and a function of the cooler state estimation unit 53 will be described with reference to FIG. 3.

Figure 3:
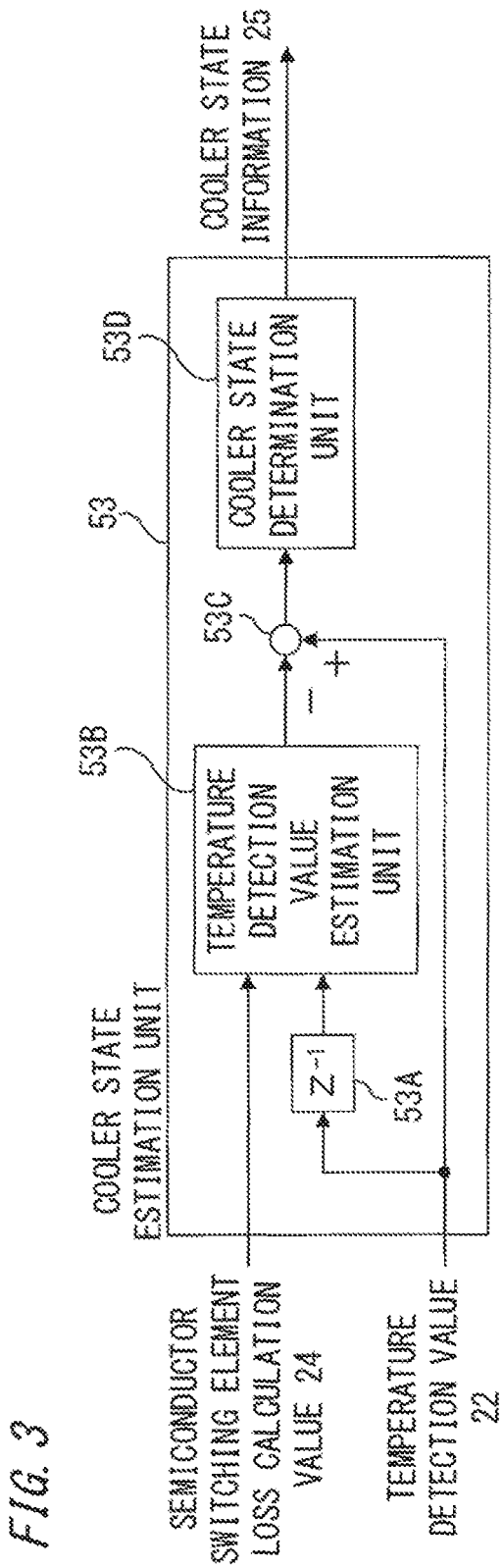
FIG. 3 is a block diagram showing a configuration of a cooler state estimation unit of the power conversion device according to the first embodiment.

FIG. 3 is a block, diagram showing a configuration of the cooler state estimation unit 53.

The cooler state estimation unit 53 includes a temperature detection value holding unit 53A, a temperature detection value estimation unit 53B, an adder/subtractor 53C, and a cooler state determination unit 53D.

The temperature detection value holding unit 53A holds previous temperature detection values 22 detected by the temperature detectors 17a to 17d.

The temperature detection value estimation unit 53B estimates a present temperature detection value on the basis of each previous temperature detection value 22 held by the temperature detection value holding unit 53A and the corresponding semiconductor switching element loss calculation value 24 from the semiconductor switching element loss calculation unit 52.

The adder/subtractor 53C calculates the difference between an estimated value of the present temperature detection value and the corresponding temperature detection value 22.

The cooler state determination unit 53D determines the state of the cooler 35 from the output the difference between the estimated value of; the present temperature detection value and the temperature detection value 22) from the adder/subtractor 53C.

Here, the cooler 35 of the power conversion device 100 according to the first embodiment is assumed to be a water-based cooler. The state of the cooler 35 to be determined by the cooler state determination unit 53D is classified into two types which are a normal cooler state and an abnormal cooler state due to leakage of cooling water.

In the temperature detection value estimation unit 53B, a correlation between each temperature detection value 22 and a loss in the corresponding semiconductor switching element is stored in advance.

The temperature detection value estimation unit 53B estimates a present temperature detection value to be detected, on the basis of the present loss in the semiconductor switching element, the previous temperature detection value 22, and the correlation stored in the temperature detection value estimation unit 53B. An "estimated temperature detection value to be detected" is referred to as an "estimated value of the temperature detection value".

Here, the temperature detection value to be detected means a temperature detection value when the cooler 35 is normal.

The cooler state determination unit 53D sets a threshold value for the difference between the estimated value of the temperature detection value and the temperature detection value 22. If the difference exceeds the set threshold value, the cooler state determination unit 53D outputs, as the cooler state information 25, the indication that the cooler is abnormal.

The correlation between the temperature detection value 22 and the loss in the semiconductor switching element is approximated by a zero- or higher-order lag element.

When the protection in a steady operation for which no temporal element has to be considered is intended, approximation at zero order (approximation only by the heat resistances) is enough to implement the present invention, and processing load in the control unit 50A can be reduced.

Meanwhile, when variation in the output from the power conversion circuit 10 is great and a temporal element needs to be considered, approximation by a first- or higher-order lag element (approximation by the heat resistances and the heat capacities) is preferable. As the order for the correlation is increased, the correlation can be approximated with higher accuracy, but the processing load in the control unit 50A becomes greater. Thus, it is necessary to select an appropriate order.

Next, a predetermined protection operation in the power conversion device 100 according to the first embodiment will be described.

In the predetermined protection operation, if the temperature detection values 22 exceed threshold values having been set for the temperature detection values 22, the switching patterns of the semiconductor switching elements 13a to 13d are controlled so as to limit currents flowing in the semiconductor switching elements 13a to 13d.

Each threshold value is set on the assumption that the state of the cooler 35 is normal. The threshold value is set for the purpose of performing the protection operation if a predetermined operation range is exceeded.

In addition, if the cooler state information 25 which is the output from the cooler state estimation unit 53 indicates the cooler abnormality, the power conversion device 100 controls the switching patterns of the semiconductor switching elements 13a to 13d so as to limit currents in the semiconductor switching elements 13a to 13d in the same manner.

As described above, in the power conversion device 100 according to the first embodiment, the state of the cooler 35 is estimated, and the protection operation is performed according to the state of the cooler. Accordingly, although conventional methods do not allow appropriate protection to be performed when the state of the cooler 35 is changed, the protection operation can be reliably performed also in the case.

In addition, since the state of the cooler 35 is estimated using the correlation approximated by a zero- or higher-order lag element, it is possible to estimate the state of the cooler so as to accurately follow a time-dependent change in the output while reducing the processing load in the control unit 50a.

As described above, the power conversion device according to the first embodiment includes: the semiconductor switching elements which convert power; the cooler which cools the semiconductor switching elements; the control unit which controls the semiconductor switching elements; the temperature detectors which detect the temperatures of the semiconductor switching elements; the current detectors which detect currents flowing to the semiconductor switching elements; and the voltage detectors which detect voltages that are applied to the semiconductor switching elements. The control unit calculates losses in the semiconductor switching elements with use of the switching states of the semiconductor switching elements, and the current detection values or voltage detection values. The control unit estimates the state of the cooler from the loss calculation values and the temperature detection values. The control unit limits currents flowing to the semiconductor switching elements on the basis of the state of the cooler. Accordingly, the power conversion device according to the first embodiment enables the protection operation to be reliably performed even when the state of the cooler is changed.

Second Embodiment

A power conversion device according to a second embodiment is different from the power conversion device according to the first embodiment in that a junction temperature calculation unit is additionally provided to the control unit so as to also allow a protection operation based on junction temperature calculation values.

Hereinafter, an operation of the power conversion device according to the second embodiment will be described focusing on differences from that in the first embodiment with reference to FIG. 4 which is a block diagram showing a configuration of the control unit and FIG. 5 which is a block, diagram showing a configuration of the junction temperature calculation unit.

Figure 4:
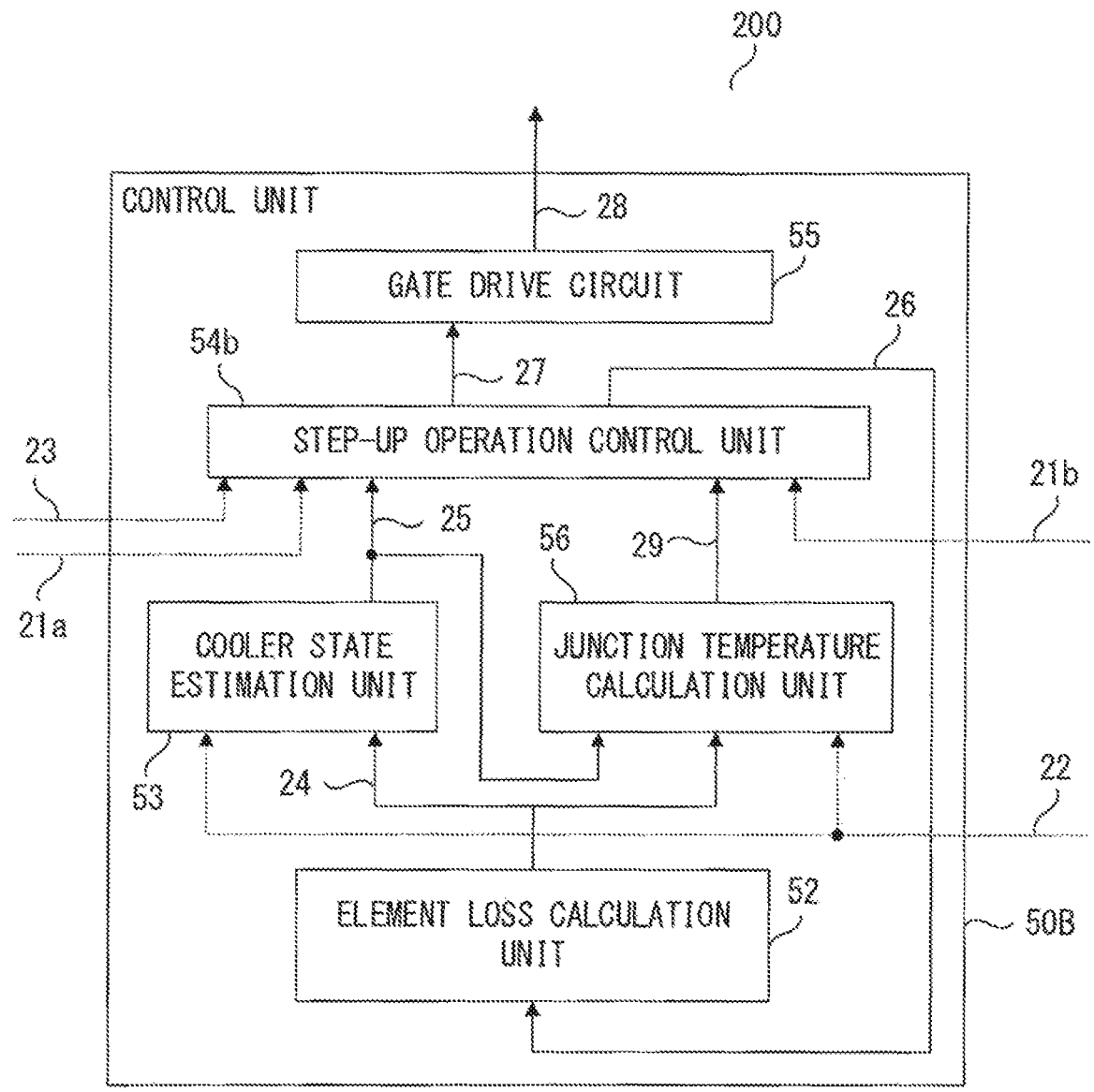
FIG. 4 is a block diagram showing a configuration of a control unit of a power conversion device according to second embodiment.
Figure 5:
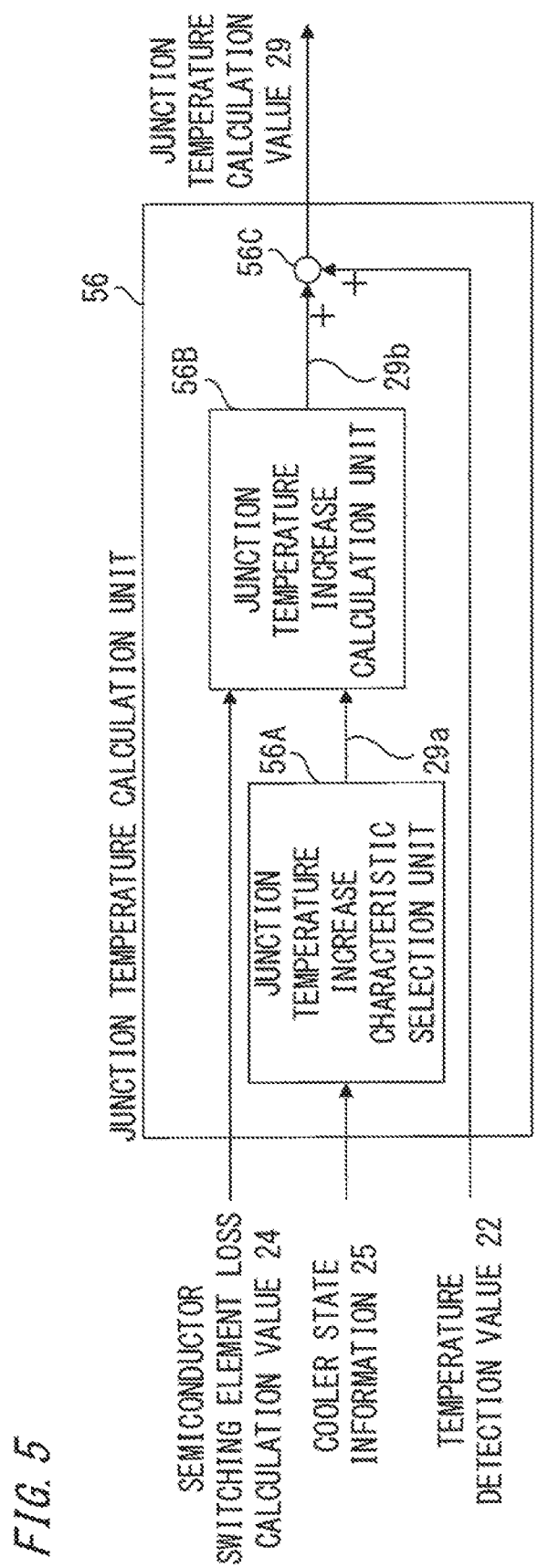
FIG. 5 is a block diagram showing a configuration of a junction temperature calculation unit of the power conversion device according to the second embodiment.

In FIG. 4 which is the block diagram showing the configuration of the control unit in the second embodiment, parts that are the same as or correspond to those in the first embodiment are denoted by the same reference characters.

The power conversion device, the control unit, and the step-up operation control unit are denoted by 200, 50B, and 54b, respectively, for discrimination from those in the first embodiment.

The power conversion device 200 according to the second embodiment includes the power conversion circuit 10 and the control unit 50B. The power conversion circuit 10 is the same as that of the power conversion device 100 according to the first embodiment, and thus a configuration and a function of the control unit 50B will be described.

The control unit 50B includes the semiconductor switching element loss calculation unit 52, the cooler state estimation unit 53, the step-up operation control unit 54b, the gate drive circuit 55, and further a junction temperature calculation unit 56.

The junction temperature calculation unit 56 includes a junction temperature increase characteristic selection unit 56A, a junction temperature increase calculation unit 56B, and an adder/subtractor 56C.

Information added to the power conversion device according to the first embodiment will be described before the function and the operation of the control unit 50B are described.

An output signal from the junction temperature calculation unit 56 is referred to as a junction temperature calculation value 29. An output signal from the junction temperature increase characteristic selection unit 56A is referred to as a junction temperature increase characteristic 29a. An output signal from the junction temperature increase calculation unit 56B is referred to as a junction temperature increase value 29b.

The semiconductor switching element loss calculation unit 52 receives the semiconductor switching element loss calculation information 26 from the step-up operation control unit 54b, calculates the losses in the semiconductor switching elements, and outputs the semiconductor switching element loss calculation values 24.

The cooler state estimation unit 53 receives the semiconductor switching element loss calculation values 24 from the semiconductor switching element loss calculation unit 52 and the temperature detection values 22 from the temperature detectors 17a to 17d, estimates the state of the cooler 35, and outputs the cooler state information 25.

The step-up operation control unit 54b receives the cooler state information 25 from the cooler state estimation unit 53, the input voltage detection value 21a from the input voltage detector 15, the reactor current detection values 23 from the reactor current detectors 16a and 16b, and the output voltage detection value 21b from the output voltage detector 18.

When receiving them, the step-up operation control unit 54b outputs the gate control signal 27 for controlling the step-up operation of the power conversion circuit 10 by switching ON/OFF of the semiconductor switching elements 13a to 13d. In addition, the step-up operation control unit 54b outputs the semiconductor switching element loss calculation information 26.

The gate drive circuit 55 converts, into the gate drive signal 28, the gate control signal 27 generated by the step-up operation control unit 54b.

The junction temperature calculation unit 56 receives the cooler state information 25 from the cooler state estimation unit 53, the semiconductor switching element loss calculation values 24 from the semiconductor switching element less calculation unit 52, and the temperature detection values 22, and outputs junction temperature calculation values 29.

The step-up operation control unit 54b of the control unit 50B of the power conversion device 200 according to the second embodiment determines and controls the switching patterns of the semiconductor switching elements 13a to 13d such that the output voltage Vo becomes the target value, as does the step-up operation control unit 54a of the control unit 50A in the first embodiment.

In addition, the step-up operation control unit 54b performs a predetermined protection operation on the basis of the cooler state information 25 from the cooler state estimation unit 53, the junction temperature calculation values 29 from the junction temperature calculation unit 56, and the temperature defection values 22 from the temperature detectors 17a to 17d.

A method for estimating junction temperatures which is the main feature of the power conversion device 200 according to the second embodiment, will be described.

The junction temperature calculation unit 56 calculates the junction temperatures of the semiconductor switching elements 13a to 13d on the basis of the semiconductor switching element loss calculation values 24 from the semiconductor switching element loss calculation unit 52, the cooler state information 25 from the cooler state estimation unit 53, and the temperature detection values 22 from the temperature detectors 17a to 17d.

Here, the junction temperature calculation values 29 outputted from the junction temperature calculation unit 56 can be fed back and inputted to the semiconductor switching element loss calculation unit 52.

If the junction temperature calculation values 29 are inputted to the semiconductor switching element loss calculation unit 52, a junction temperature dependence can be added to the loss characteristics of the switching elements and the flyback diodes held in advance in the semiconductor switching element loss calculation unit 52. Accordingly, the semiconductor switching element loss calculation unit 52 can more accurately derive the losses in the semiconductor switching elements.

Next, a function of the junction temperature calculation unit 56 will be described with reference to FIG. 5.

The junction temperature increase characteristic selection unit 56A receives the cooler state information 25 from the cooler state estimation unit 53, and selects a junction temperature increase characteristic 29a corresponding to the state of the cooler 35.

The junction temperature increase calculation unit 56B receives the junction temperature increase characteristic 29a from the junction temperature increase characteristic selection unit 56A and the semiconductor switching element loss calculation values 24 from the semiconductor switching element loss calculation unit, and calculates junction temperature increase values 23b.

The adder/subtractor 56C adds the junction temperature increase values 29b from the junction temperature increase calculation unit 56B and the temperature detection values 22, to obtain the junction temperature calculation values 29.

As in the first embodiment, the cooler 35 of the power conversion device 200 according to the second embodiment is assumed to be a water-based cooler. The state of the cooler 35 to be determined by the cooler state determination unit 53D is classified into two types which are a normal cooler state and an abnormal cooler state due to leakage off cooling water.

The junction temperature increase characteristic 29a selected by the junction temperature increase characteristic selection unit 56A is a temperature increase characteristic that corresponds to either of the two types of states of the cooler 35, i.e., the normal cooler state and the abnormal cooler state due to leakage of cooling water.

For each state of the cooler 35, the junction temperature increase characteristic selection unit 56A stores, in advance, a correlation between the difference in temperature between each of the temperature detectors 17a to 17d and the junction of the corresponding one of the semiconductor switching elements 13a to 13d and the loss in the semiconductor switching element. The junction temperature increase characteristic selection unit 56A selects and outputs an appropriate one of the correlations on the basis of the cooler state information 25 about the cooler 35.

Here, the correlation between the difference in temperature between each of the temperature detectors 17a to 17d and the junction of the corresponding one of the semiconductor switching elements 13a to 13d and the loss in the semiconductor switching element, is approximated by a zero- or higher-order lag element for the same reason as that for the correlation between temperature detection value 22 and the loss in the semiconductor switching element.

A predetermined protection operation of the power conversion device 200 according to the second embodiment will be described.

In the predetermined protection operation, if the junction temperature calculation values 29 exceed threshold values having been set for the junction temperature calculation values 29, the switching patterns of the semiconductor switching elements 13a to 13d are controlled so as to limit currents flowing in the semiconductor switching elements.

Each threshold value is set on the assumption that the state of the cooler 35 is normal. The threshold value is set to perform the protection operation if a predetermined operation range is exceeded.

In addition, if the cooler state information 25 indicates a cooler abnormality, currents are limited by controlling the switching patterns of the semiconductor switching elements 13a to 13d such that the junction temperature of each of the semiconductor switching elements 13a to 13d becomes a predetermined threshold value or smaller.

As described above, in the power conversion device 200 according to the second embodiment, the correlation between the difference in temperature between each of the temperature detectors 17a to 17d and the junction of the corresponding one of the semiconductor switching elements 13a to 13d and the loss in the semiconductor switching element, is appropriately selected according to the state of the cooler 35, and the junction temperature is estimated.

Accordingly, even when the state of the cooler 35 is changed, the junction temperatures of the semiconductor switching elements 13a to 13d can be accurately estimated. In addition, since the junction temperatures are monitored even in the abnormal, cooler state, the protection operation can be reliably performed.

The power conversion device according to the second embodiment is different from the power conversion device according to the first embodiment in that the junction temperature calculation unit is additionally provided to the control unit so as to allow the protection operation based on the junction temperature calculation values.

Therefore, the power conversion device according to the second embodiment enables the protection operation to be reliably performed even when the state of the cooler is changed. Furthermore, since the junction temperatures are monitored, the protection operation can be reliably performed.

Third Embodiment

In a power conversion device according to a third embodiment, one of a plurality of abnormal cooler states is determined relative to the case where the cooler is normal, and, for the abnormal state, a corresponding one of predetermined appropriate protection operations is performed.

In addition, a modification of the power conversion device according to either of the first and second embodiments will be described in the third embodiment.

Hereinafter, a configuration of the power conversion device according to the third embodiment is the same as the configuration of the power conversion device according to each of the first and second embodiments.

An operation of the power conversion device according to the third embodiment will be described focusing on differences from those in the first and second embodiments.

In the power conversion device according to each of the first and second embodiments, the state of the cooler 35 is assumed to be classified into two types of states, i.e., the normal state and the abnormal state.

However, the abnormality of the cooler 35 is considered to include not only cooling water being lost but also different levels of abnormalities such as leakage of cooling water.

In the power conversion device according to the third embodiment, the abnormal state is classified into a plurality of levels from minor water leakage to cooling water being lost relative to the case where the cooler is normal, and, for each level, a corresponding one of the predetermined appropriate protection operations is performed.

Next, the states of the cooler and the protection operations in the power conversion device according to the third embodiment will be described.

A plurality of threshold values corresponding to the states of the cooler 35 are set for the difference between an estimated value of the temperature from any of the temperature detectors 17 assumed to be obtained in the normal cooler state and a detected value of the temperature, and one of the abnormal states of the cooler 35 is determined.

According to the determined one of the plurality of abnormal states of the cooler 35, the power conversion device according to the third embodiment performs the corresponding one of the predetermined protection operations.

An example of the predetermined protection operations is current limitation. Specifically, the switching patterns of the semiconductor switching elements 13a to 13d are controlled so as to limit currents flowing in the semiconductor switching elements 13a to 13d. According to the state of the cooler 35, the value for the current limitation is changed, or the operations of the semiconductor switching elements 13a to 13d are stopped.

If the protection operations are optimally set according to the abnormal stare of the cooler 35, it is possible to perform the protection operations while minimizing loss of the function as the power conversion device in the abnormal state.

Next, a modification of the power conversion device according to either of the first and second embodiments will be described.

Although each semiconductor module 30 in the power conversion device according to each of the first and second embodiments is composed of one semiconductor switching element 13 and one temperature detector 17, the present invention is not limited thereto. The semiconductor module 30 may be composed of, for example, a plurality of semiconductor switching elements and one temperature detector.

In this case, the one temperature detector is disposed at such a predetermined location as to establish a correlation with the temperature of each semiconductor switching element.

Here, correlations between temperature detection values and losses in the semiconductor switching elements are each approximated by a zero- or higher-order lag system, and the temperature detection value estimation unit 53B stores the sum of the correlations obtained through the approximation by the zero- or higher-order lag system. The cooler state estimation unit 53 determines the state of the cooler with use of the sum of the correlations.

The estimations of the junction temperatures of the respective semiconductor switching elements are performed in the following manner: for each semiconductor switching element, a correlation between the difference in temperature between the one temperature detector and the junction of the semiconductor switching element and the loss in the semiconductor switching element, is approximated by a zero- or higher-order lag system and stored in the junction temperature increase characteristic selection unit 56A, and the junction temperature calculation unit 56 calculates a junction temperature with use of the correlation for the semiconductor switching element.

With this configuration, the plurality of semiconductor switching elements can be protected with the one temperature detector, and thus overheat protection can be performed without increasing the number of components, whereby the cost for and the size of the power conversion device can be reduced.

The power conversion device according to either of the first and second embodiments may include a plurality of groups of semiconductor switching elements and temperature detectors near the semiconductor switching elements.

In the estimations of the junction temperatures, the thermal correlations between the semiconductor switching elements and the temperature detectors are intense, and less interference from other semiconductor switching elements leads to higher accuracies of the estimations.

When the power conversion device is composed of the plurality of semiconductor switching elements, if the power conversion device includes a plurality of groups which are each composed of one temperature detector and a plurality of semiconductor switching elements, the number of interfering factors, i.e., the semiconductor switching elements, per temperature detector is less, and thus the accuracies of the estimations of the junction temperatures can be increased.

In the power conversion device according to each of the first and second embodiments, it is assumed that the cooler is a water-based cooler and the state of the cooler is classified into the normal cooler state and leakage of cooling water. However, the present invention is not limited thereto. For example, an abnormality in the temperature of the cooler may be classified into one of the abnormal cooler states.

In the power conversion device according to each of the first and second embodiments, the cooler is a water-based cooler. However, the cooler is not limited thereto, and may be, for example, a cooling fan. In this case, the state of the cooler to be determined is assumed to be classified into cooler normality and cooler abnormality, including cooling fan failure and clogging in the fan.

In the power conversion device according to the third embodiment, one of the plurality of abnormal cooler states is determined relative to the case where the cooler is normal, and, for the abnormal state, a corresponding one of the predetermined appropriate protection operations is performed.

Therefore, the power conversion device according to the present third embodiment can reliably perform the protection operation even when the state of the cooler is changed.

Furthermore, the power conversion device can perform the optimal protection operation according to the abnormal state of the cooler.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 10 power conversion circuit
11 input smoothing capacitor
12a, 12b step-up reactor
13, 13a to 13d semiconductor switching element
14 output smoothing capacitor
15 input voltage detector
16a, 16b reactor current detector
17, 17a to 17d temperature detector
18 output voltage detector
21a, 21b input voltage detection value
22 temperature detection value
23 reactor current detection value
24 semiconductor switching element loss calculation value
25 cooler state information
26 semiconductor switching element loss calculation information
27 gate control signal
28 gate drive signal
29 junction temperature calculation value
29a junction temperature increase characteristic
29b junction temperature increase value
30, 30a to 30d semiconductor module
31 bus bar
32 solder
33 substrate
34 insulating member
35 cooler
36 cooling water
37 heat resistance (between junction of semiconductor switching element and substrate)
38a, 38b heat resistance (in substrate)
39a to 39c heat resistance (between substrate and cooler)
40 heat resistance (between thermistor and substrate)
41a, 41b heat resistance (in cooler)
42a to 42c heat resistance (between cooling water and cooler)
50A, 50B control unit
52 semiconductor switching element loss calculation unit
53 cooler state estimation unit
53A temperature detection value holding unit
53B temperature detection value estimation unit
53C, 56C adder/subtractor 53D cooler state determination unit
54a, 54b step-up operation control unit
55 gate drive circuit
56 junction temperature calculation unit
56A junction temperature increase characteristic selection unit
56B junction temperature increase calculation uni
100, 200 power conversion device

What is claimed is:

1. A power conversion device comprising:
a semiconductor switching element which converts power by a switching operation;
a cooler which cools the semiconductor switching element;
a control unit which controls the semiconductor switching element;
a temperature detector which detects a temperature of the semiconductor switching element;
a current detector which detects current flowing to the semiconductor switching element; and
a voltage detector which detects voltage applied to the semiconductor switching element,
wherein the control unit includes
a semiconductor switching element loss calculation unit which calculates a loss in the semiconductor switching element with use of a switching state of the semiconductor switching element, and both or either of a current detection value and a voltage detection value; and
a cooler state estimation unit which estimates a state of the cooler from a loss calculation value from the semiconductor switching element loss calculation unit and a temperature detection value from the temperature detector, and the control unit limits current flowing to the semiconductor switching element on the basis of the state of the cooler,
wherein the cooler state estimation unit includes
a temperature detection value holding unit which holds a previous temperature detection value,
a temperature detection value estimation unit which estimates a temperature detection estimation value with use of the held temperature detection value and the loss calculation value of the semiconductor switching element, and
a cooler state determination unit which estimates the state of the cooler through comparison between the temperature detection estimation value and the temperature detection value.

2. The power conversion device according to claim 1, wherein the control unit limits current flowing to the semiconductor switching element also on the basis of the temperature detection value.

3. The power conversion device according to claim 2, wherein the temperature detection value estimation unit approximates, by a zero- or higher-order lag system, a correlation between the held temperature detection value and the temperature detection estimation value on the basis of the loss calculation value of the semiconductor switching element.

4. The power conversion device according to claim 3, wherein
the control unit includes a junction temperature calculation unit which estimates a junction temperature of the semiconductor switching element on the basis of the loss calculation value of the semiconductor switching element, the state of the cooler, and the temperature detection value, and
the control unit limits current flowing to the semiconductor switching element on the basis of the junction temperature.

5. The power conversion device according to claim 2, wherein
the control unit includes a junction temperature calculation unit which estimates a junction temperature of the semiconductor switching element on the basis of the loss calculation value of the semiconductor switching element, the state of the cooler, and the temperature detection value, and
the control unit limits current flowing to the semiconductor switching element on the basis of the junction temperature.

6. The power conversion device according to claim 5, wherein the junction temperature calculation unit includes
a junction temperature characteristic selection unit which selects, according to the state of the cooler, a correlation between the loss calculation value of the semiconductor switching element and a difference between the temperature detection value and the junction temperature of the semiconductor switching element, and
a junction temperature increase calculation unit which calculates a temperature increase value which is the difference between the temperature detection value and the junction temperature of the semiconductor switching element with use of the correlation selected by the junction temperature characteristic selection unit, the loss calculation value of the semiconductor switching element, and the temperature detection value, and
the junction temperature calculation unit adds the temperature detection value and the temperature increase value, to estimate the junction temperature of the semiconductor switching element.

7. The power conversion device according to claim 2, the power conversion device comprising one temperature detector which detects a temperature at such a location as to establish a correlation with temperatures of a plurality of the semiconductor switching elements.

8. The power conversion device according to claim 2, the power conversion device comprising a plurality of groups of the semiconductor switching element and the temperature detector, each of the plurality of groups of the semiconductor switching element and the temperature detector including one temperature detector which detects a temperature at such a location as to establish a correlation with temperatures of a plurality of the semiconductor switching elements.

9. The power conversion device according to claim 2, wherein
the state of the cooler is classified into a normal state and a plurality of abnormal states, and
current flowing to the semiconductor switching element is limited on the basis of any of the plurality of abnormal states.

10. The power conversion device according to claim 1, wherein the temperature detection value estimation unit approximates, by a zero- or higher-order lag system, a correlation between the held temperature detection value and the temperature detection estimation value on the basis of the loss calculation value of the semiconductor switching element.

11. The power conversion device according to claim 10, wherein
the control unit includes a junction temperature calculation unit which estimates a junction temperature of the semiconductor switching element on the basis of the loss calculation value of the semiconductor switching element, the state of the cooler, and the temperature detection value, and the control unit limits current flowing to the semiconductor switching element on the basis of the junction temperature.

12. The power conversion device according to claim 1, wherein the control unit includes a junction temperature calculation unit which estimates a junction temperature of the semiconductor switching element on the basis of the loss calculation value of the semiconductor switching element, the state of the cooler, and the temperature detection value, and the control unit limits current flowing to the semiconductor switching element on the basis of the junction temperature.

13. The power conversion device according to claim 12, wherein the junction temperature calculation unit includes a junction temperature characteristic selection unit which selects, according to the state of the cooler, a correlation between the loss calculation value of the semiconductor switching element and a difference between the temperature detection value and the junction temperature of the semiconductor switching element, and a junction temperature increase calculation unit which calculates a temperature increase value which is the difference between the temperature detection value and the junction temperature of the semiconductor switching element with use of the correlation selected by the junction temperature characteristic selection unit, the loss calculation value of the semiconductor switching element, and the temperature detection value, and the junction temperature calculation unit adds the temperature detection value and the temperature increase value, to estimate the junction temperature of the semiconductor switching element.

14. The power conversion device according to claim 13, wherein the correlation selected by the junction temperature characteristic selection unit is approximated by a zero- or higher-order lag system.

15. The power conversion device according to claim 1, the power conversion device comprising one temperature detector which detects a temperature at such a location as to establish a correlation with temperatures of a plurality of the semiconductor switching elements.

16. The power conversion device according to claim 1, the power conversion device comprising a plurality of groups of the semiconductor switching element and the temperature detector, each of the plurality of groups of the semiconductor switching element and the temperature detector including one temperature detector which detects a temperature at such a location as to establish a correlation with temperatures of a plurality of the semiconductor switching elements.

17. The power conversion device according to claim 1, wherein the state of the cooler is classified into a normal state and a plurality of abnormal states, and current flowing to the semiconductor switching element is limited on the basis of any of the plurality of abnormal states.

18. A power conversion device comprising:

a semiconductor switching element which converts power by a switching operation;

a cooler which cools the semiconductor switching element;

a control unit which controls the semiconductor switching element;

a temperature detector which detects a temperature of the semiconductor switching element;

a current detector which detects current flowing to the semiconductor switching element; and a voltage detector which detects voltage applied to the semiconductor switching element, wherein the control unit includes a semiconductor switching element loss calculation unit which calculates a loss in the semiconductor switching element with use of a switching state of the semiconductor switching element, and both or either of a current detection value and a voltage detection value; and a cooler state estimation unit which estimates a state of the cooler from a loss calculation value from the semiconductor switching element loss calculation unit and a temperature detection value from the temperature detector, wherein the control unit limits current flowing to the semiconductor switching element on the basis of the state of the cooler, wherein the control unit includes a junction temperature calculation unit which estimates a junction temperature of the semiconductor switching element on the basis of the loss calculation value of the semiconductor switching element, the state of the cooler, and the temperature detection value, and wherein the control unit limits current flowing to the semiconductor switching element on the basis of the junction temperature.

19. The power conversion device according to claim 18, wherein the junction temperature calculation unit includes a junction temperature characteristic selection unit which selects, according to the state of the cooler, a correlation between the loss calculation value of the semiconductor switching element and a difference between the temperature detection value and the junction temperature of the semiconductor switching element, and a junction temperature increase calculation unit which calculates a temperature increase value which is the difference between the temperature detection value and the junction temperature of the semiconductor switching element with use of the correlation selected by the junction temperature characteristic selection unit, the loss calculation value of the semiconductor switching element, and the temperature detection value, and wherein the junction temperature calculation unit adds the temperature detection value and the temperature increase value, to estimate the junction temperature of the semiconductor switching element.

20. The power conversion device according to claim 19, wherein the correlation selected by the junction temperature characteristic selection unit is approximated by a zero- or higher-order lag system.

* * * * *